(12) United States Patent
Chen et al.

(10) Patent No.: US 11,024,557 B2
(45) Date of Patent: Jun. 1, 2021

(54) SEMICONDUCTOR PACKAGE STRUCTURE HAVING VAPOR CHAMBER THERMALLY CONNECTED TO A SURFACE OF THE SEMICONDUCTOR DIE

(71) Applicant: Advanced Semiconductor Engineering, Inc., Kaohsiung (TW)

(72) Inventors: Hsin-En Chen, Kaohsiung (TW); Ian Hu, Kaohsiung (TW); Jin-Feng Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/566,495

(22) Filed: Sep. 10, 2019

(65) Prior Publication Data
US 2020/0091036 A1 Mar. 19, 2020

Related U.S. Application Data

(60) Provisional application No. 62/731,712, filed on Sep. 14, 2018.

(51) Int. Cl.
*H01L 23/427* (2006.01)
*H01L 23/00* (2006.01)

(52) U.S. Cl.
CPC ............ *H01L 23/427* (2013.01); *H01L 24/16* (2013.01); *H01L 24/32* (2013.01); *H01L 24/73* (2013.01); *H01L 24/33* (2013.01); *H01L 2224/16225* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01)

(58) Field of Classification Search
CPC ....... H01L 23/42; H01L 23/427; H01L 23/46; H01L 23/473
See application file for complete search history.

(56) References Cited

U.S. PATENT DOCUMENTS

2015/0179617 A1\* 6/2015 Lin ..................... H01L 25/0652
257/713

\* cited by examiner

*Primary Examiner* — Hoai V Pham
(74) *Attorney, Agent, or Firm* — Foley & Lardner LLP

(57) ABSTRACT

A semiconductor package structure includes a package substrate, a semiconductor die, a vapor chamber and a heat dissipating device. The package substrate has a first surface and a second surface opposite to the first surface. The semiconductor die is electrically connected to the first surface of the package substrate. The vapor chamber is thermally connected to a first surface of the semiconductor die. The vapor chamber defines an enclosed chamber for accommodating a first working liquid. The heat dissipating device is thermally connected to the vapor chamber. The heat dissipating device defines a substantially enclosed space for accommodating a second working liquid.

20 Claims, 18 Drawing Sheets

US 11,024,557 B2

SEMICONDUCTOR PACKAGE STRUCTURE HAVING VAPOR CHAMBER THERMALLY CONNECTED TO A SURFACE OF THE SEMICONDUCTOR DIE

CROSS-REFERENCE TO RELATED APPLICATIONS

This application claims the benefit of and priority to U.S. Provisional Application No. 62/731,712, filed Sep. 14, 2018, the contents of which are incorporated herein by reference in their entirety.

BACKGROUND

1. Field of the Disclosure

The present disclosure relates to a semiconductor package structure, and to a semiconductor package structure including a vapor chamber.

2. Description of the Related Art

A specification of a semiconductor package structure may include a high-speed data transmission capability, a high data capacity and a small footprint. Heat dissipation is also an issue for such a semiconductor package structure. During operation, high-speed data transmission can result in a significant amount of heat being generated and can raise a temperature of the semiconductor package structure. Due to the small size of the semiconductor package structure, it can be difficult to dissipate the heat. If the heat is not dissipated efficiently, the performance of the semiconductor package structure can be decreased, or the semiconductor package structure may break down or be rendered inoperative.

SUMMARY

In some embodiments, a semiconductor package structure includes a package substrate, a semiconductor die, a vapor chamber and a heat dissipating device. The package substrate has a first surface and a second surface opposite to the first surface. The semiconductor die is electrically connected to the first surface of the package substrate. The vapor chamber is thermally connected to a first surface of the semiconductor die. The vapor chamber defines an enclosed chamber for accommodating a first working liquid. The heat dissipating device is thermally connected to the vapor chamber. The heat dissipating device defines a substantially enclosed space for accommodating a second working liquid.

In some embodiments, a semiconductor package structure includes a package substrate, a semiconductor die, a vapor chamber and a heat dissipating device. The semiconductor die is electrically connected to the package substrate. The vapor chamber is thermally connected to the semiconductor die. The heat dissipating device is thermally connected to the vapor chamber. The vapor chamber forms a heat transfer path from the semiconductor die to the heat dissipating device.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
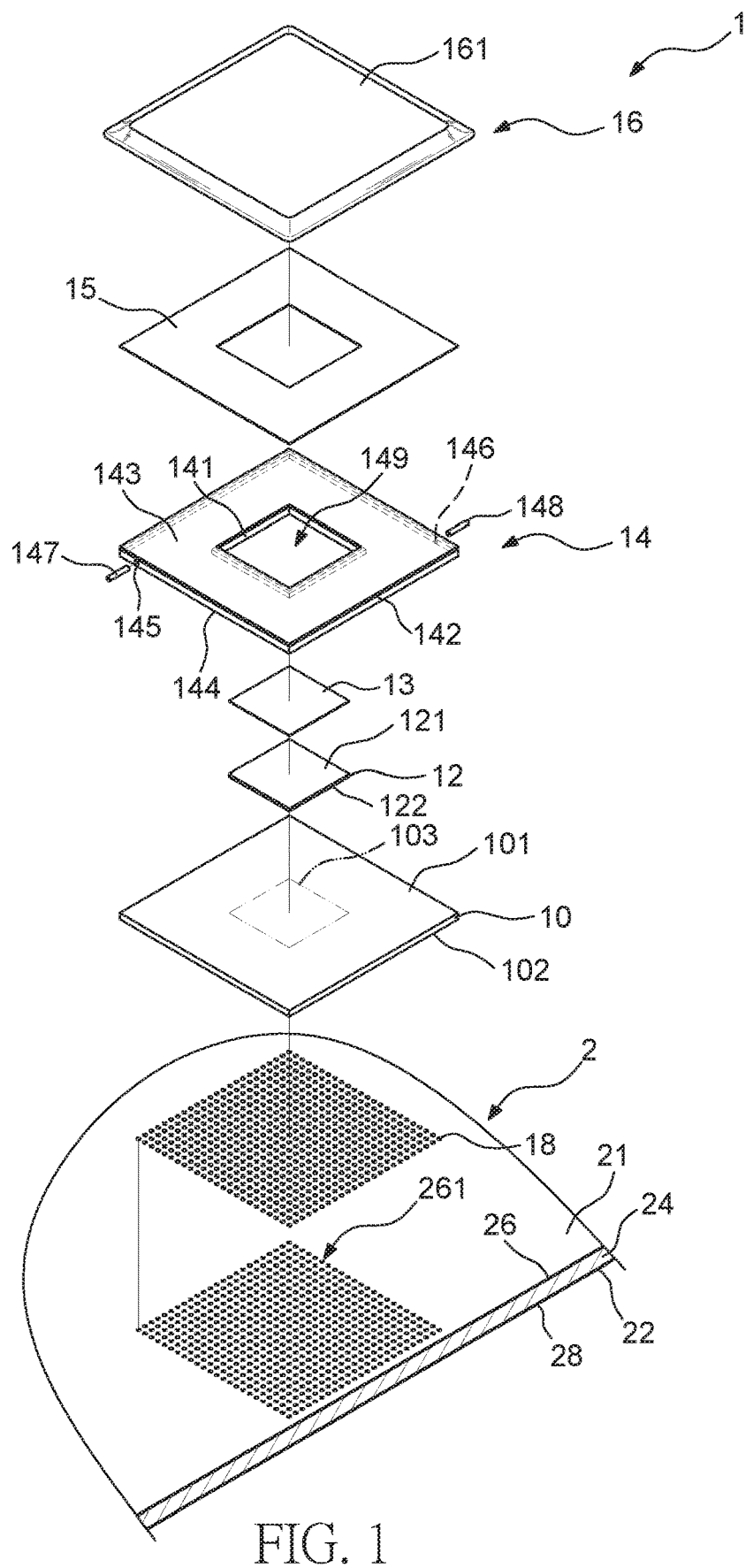
FIG. 1 illustrates an exploded perspective view of a semiconductor package structure and a main substrate according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing functions, a number of devices integrated in a semiconductor package structure should increase. Thus, the power density and a number of heat sources are increased, and the thermal resistance is relatively large. In addition, it is difficult to dissipate the heat generated by the device at the center of the semiconductor package structure. To address the above concerns, in some comparative embodiments, a fan is provided. The fan is attached to the semiconductor package structure to dissipate the heat at the periphery of the semiconductor package structure by air flow. However, such fan may not dissipate the heat generated by the device at the center of the semiconductor package structure. In some comparative embodiments, a number of substrate vias or a thickness of metal layer are increased. However, the improvement of heat dissipation efficiency is slight. In some comparative embodiments, a thermal interface material (TIM) is used to be interposed between the devices and the package substrate. However, the temperature of the device at the center of the semiconductor package structure may not be hugely reduced.

At least some embodiments of the present disclosure provide for a semiconductor package structure which has a high improvement of heat dissipation efficiency. In some embodiments, the semiconductor package structure includes a vapor chamber for evenly conducting the heat generated by a semiconductor die of the semiconductor package structure.

Figure 2:
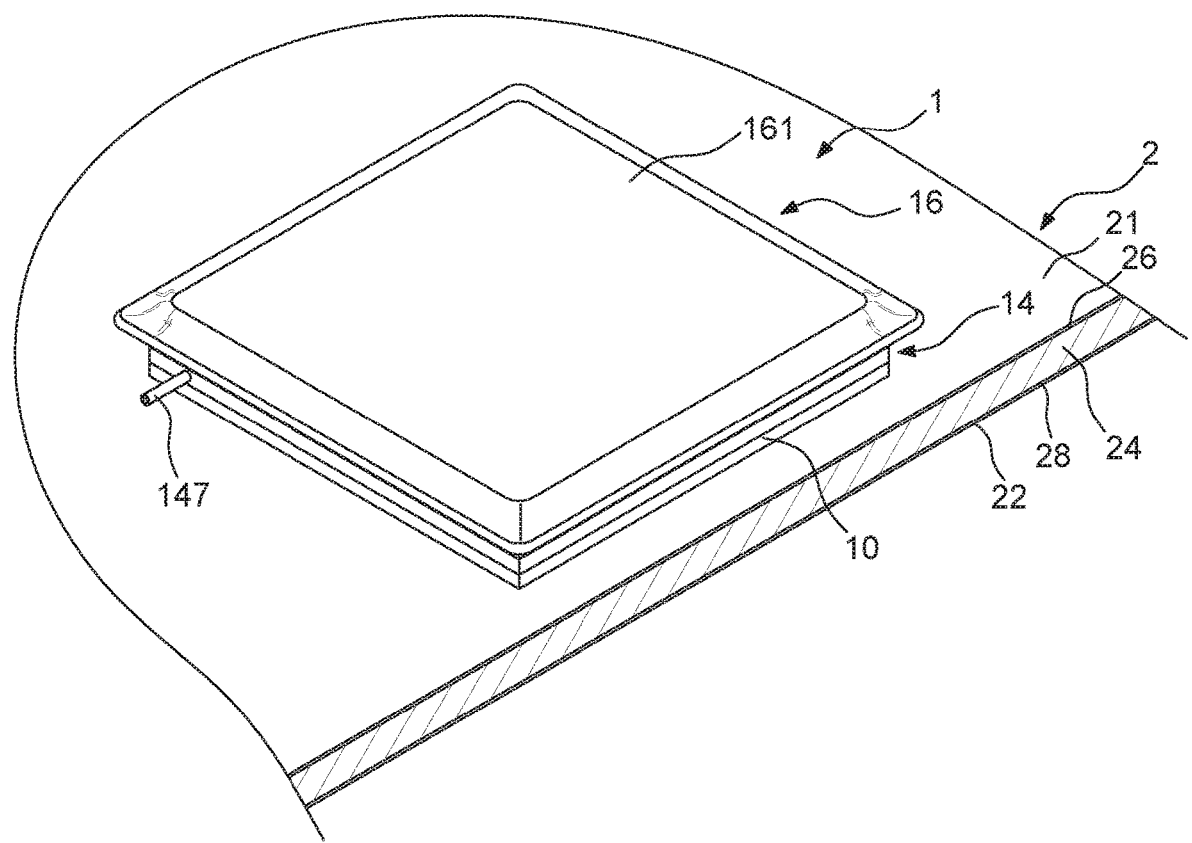
FIG. 2 illustrates an assembled perspective view of the semiconductor package structure and the main substrate of FIG. 1.
Figure 3:
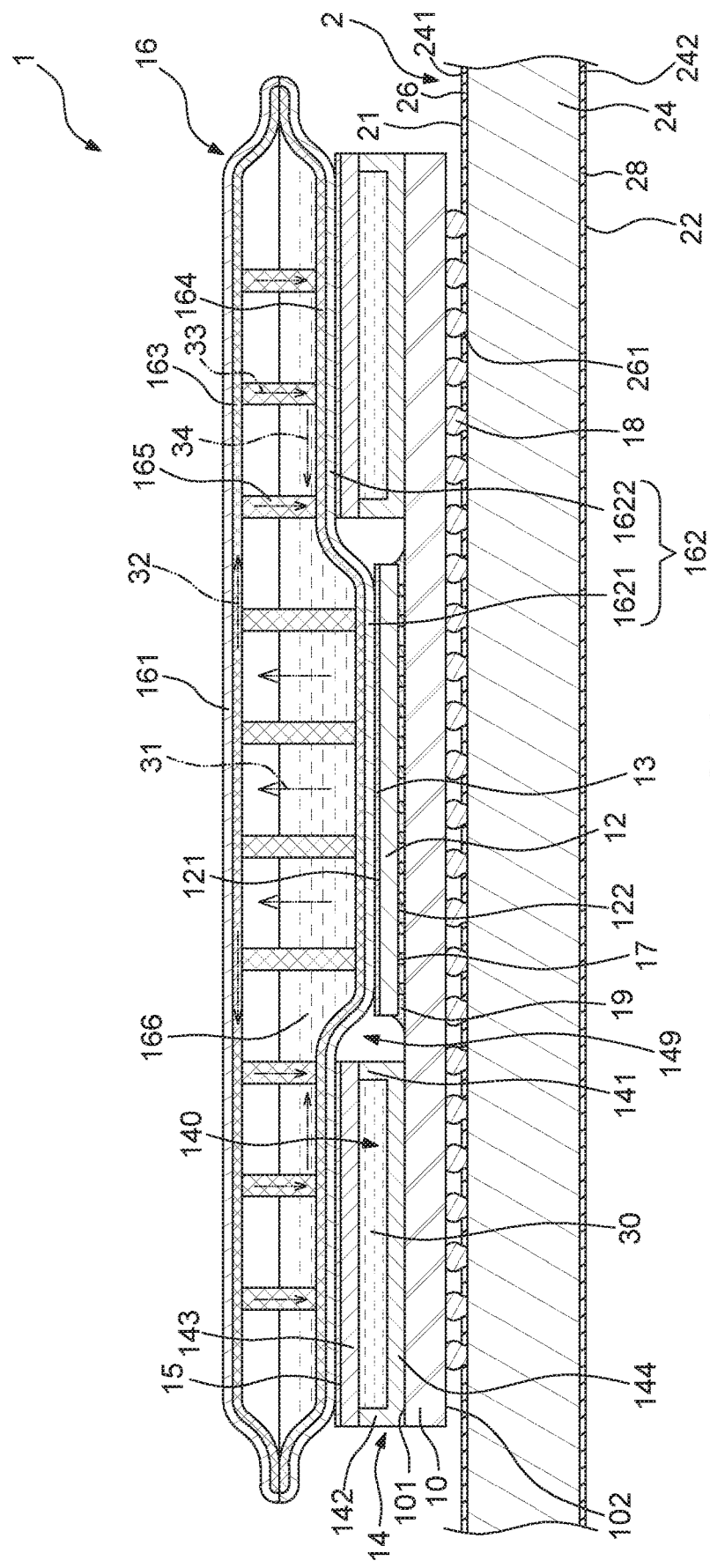
FIG. 3 illustrates a cross-sectional view of the semiconductor package structure and the main substrate of FIG. 2.
Figure 4:
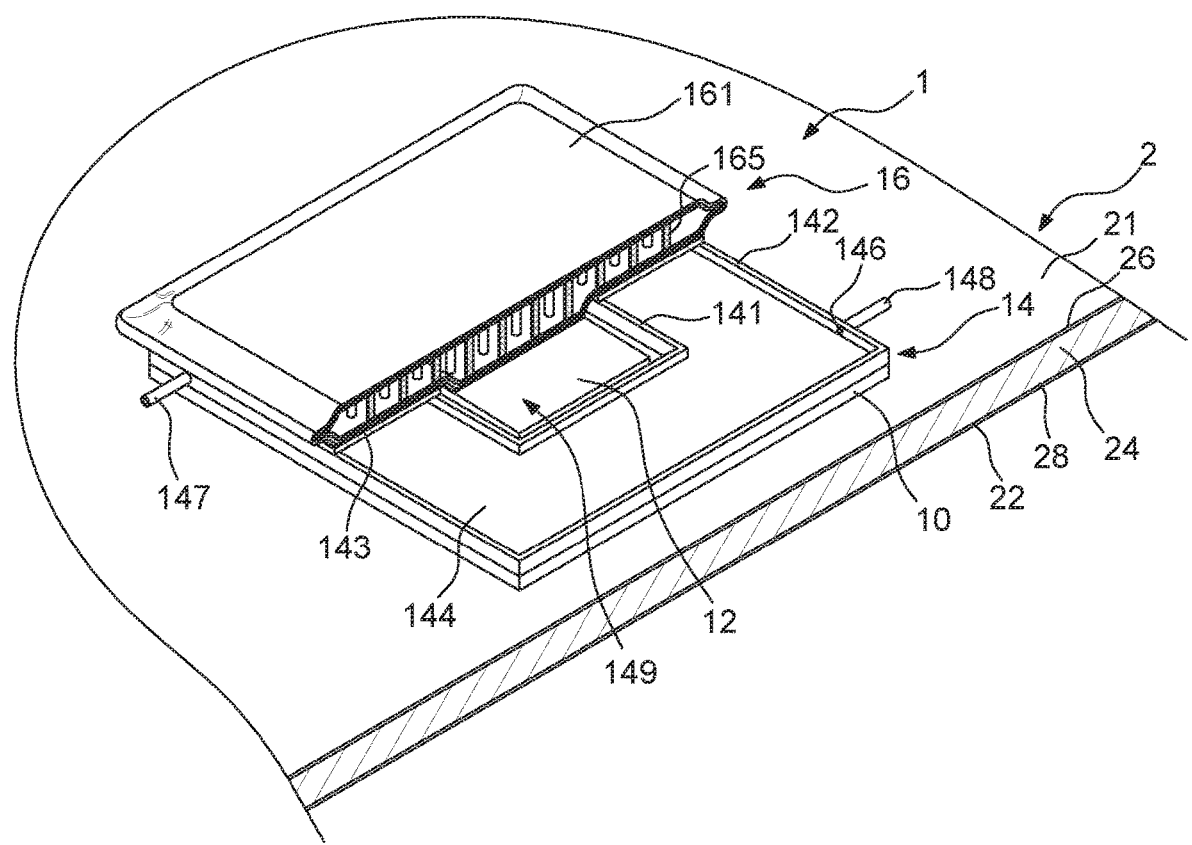
FIG. 4 illustrates a partially cross-sectional view of the semiconductor package structure and the main substrate of FIG. 2.
Figure 5:
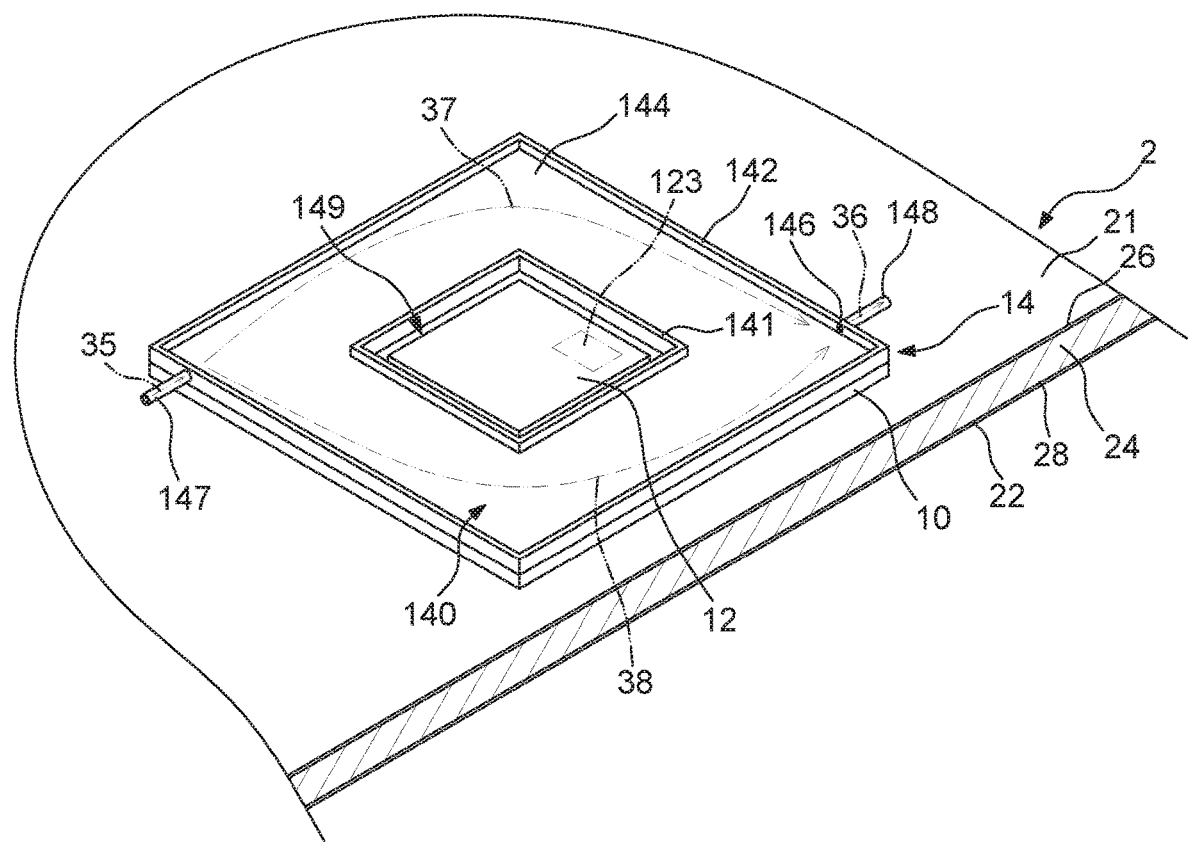
FIG. 5 illustrates an assembled perspective view of the semiconductor package structure and the main substrate of FIG. 1, wherein a vapor chamber and an upper wall of a heat dissipating device are omitted for purpose of clarity.

FIG. 1 illustrates an exploded perspective view of a semiconductor package structure 1 and a main substrate 2 according to some embodiments of the present disclosure. FIG. 2 illustrates an assembled perspective view of the semiconductor package structure 1 and the main substrate 2 of FIG. 1. FIG. 3 illustrates a cross-sectional view of the semiconductor package structure 1 and the main substrate 2 of FIG. 2. FIG. 4 illustrates a partially cross-sectional view of the semiconductor package structure 1 and the main substrate 2 of FIG. 2. FIG. 5 illustrates an assembled perspective view of the semiconductor package structure 1 and the main substrate 2 of FIG. 1, wherein the vapor chamber 16 and the upper wall 143 of the heat dissipating device 14 are omitted for purpose of clarity.

The main substrate 2 (e.g., a printed circuit board, PCB) has a first surface 21 (e.g., a top surface) and a second surface 22 (e.g., a bottom surface) opposite to the first surface 21, and includes a main body 24, a first protection layer 26 and a second protection layer 28. The main body 24 has a first surface 241 (e.g., a top surface) and a second surface 242 (e.g., a bottom surface) opposite to the first surface 241. The main body 24 may include a plurality of passivation layers (not shown) and a plurality of circuit layers (not shown) interposed between the passivation layers. The first protection layer 26 and the second protection layer 28 may be solder resist layers. The first protection layer 26 may be disposed on the first surface 241 of the main body 24, and the second protection layer 28 may be disposed on the second surface 242 of the main body 24. As shown in FIG. 1, the first protection layer 26 may define a plurality of openings 261 extending through the first protection layer 26 to expose portions of the circuit layer of the main body 24. That is, the openings 261 may not extend through the main body 24 and the second protection layer 28.

The semiconductor package structure 1 may be a flip-chip ball grid array (BGA) package, and is electrically connected to the first surface 21 of the main substrate 2. The semiconductor package structure 1 includes a package substrate 10, at least one semiconductor die 12, a thermal paste 13, a heat dissipating device 14, a thermal adhesive tape 15, a vapor chamber 16, a plurality of inner connecting elements 17 (e.g., solder bumps) and a plurality of external connecting elements 18 (e.g., solder bumps).

The package substrate 10 has a first surface 101 (e.g., a top surface) and a second surface 102 (e.g., a bottom surface) opposite to the first surface 101, and may include a plurality of passivation layers and at least one circuit layer (e.g., redistribution layer, RDL) interposed between the passivation layers. A thickness of the package substrate 10 may be about 0.8 mm to about 1.1 mm. The package substrate 10 may further include a die mounting portion 103 for receiving the semiconductor die 12. The semiconductor die 12 is electrically connected to the first surface 101 of the package substrate 10. The semiconductor die 12 has a first surface 121 (e.g., a backside surface) and a second surface 122 (e.g., an active surface) opposite to the first surface 121, and includes the inner connecting elements 17 (e.g., solder bumps) disposed adjacent to the second surface 122. A thickness of the semiconductor die 12 may be about 0.5 mm to about 0.6 mm. The semiconductor die 12 is attached to the die mounting portion 103 of the package substrate 10, and is electrically connected to the first surface 101 of the package substrate 10 through the inner connecting elements 17 (e.g., solder bumps) by flip-chip bonding. An underfill 19 may be further included to cover and protect the inner connecting elements 17 (e.g., solder bumps).

The heat dissipating device 14 surrounds the semiconductor die 12. The heat dissipating device 14 and the semiconductor die 12 are disposed between the vapor chamber 16 and the package substrate 10. In addition, the heat dissipating device 14 is thermally connected to the bottom of the vapor chamber 16. The heat dissipating device 14 includes an inner lateral wall 141, an outer lateral wall 142, an upper wall 143, a lower wall 144, at least one inlet 145, at least one outlet 146, at least one inlet pipe 147 and at least one outlet pipe 148. The material of the inner lateral wall 141, the outer lateral wall 142, the upper wall 143 and the lower wall 144 may be copper, copper alloy, aluminum alloy, stainless steel or other suitable metal. The inner lateral wall 141 is a ring shape and defines a through hole 149. The outer lateral wall 142 surrounds the inner lateral wall 141. The upper wall 143 connects a top portion of the inner lateral wall 141 and a top portion of the outer lateral wall 142. The lower wall 144 connects a bottom portion of the inner lateral wall 141 and a bottom portion of the outer lateral wall 142. Thus, the inner lateral wall 141, the outer lateral wall 142, the upper wall 143 and the lower wall 144 define a substantially enclosed space 140 for accommodating a second working liquid 30. The inlet 145 and the outlet 146 are disposed on the outer lateral wall 142. The inlet pipe 147 connects the inlet 145, and the outlet pipe 148 connects the outlet 146. Thus, the inlet pipe 147 and the outlet pipe 148 are in communication with the enclosed space 140. That is, the second working liquid 30 may flow into the enclosed space 140 through the inlet pipe 147 and the inlet 145, and the second working liquid 30 may flow out from the enclosed space 140 through the outlet pipe 148 and the outlet 146. The heat dissipating device 14 is a liquid flowing channel. The second working liquid 30 may be water. As shown in FIG. 1, the heat dissipating device 14 is a ring type that defines the through hole 149. As shown in FIG. 3, the heat dissipating device 14 surrounds the semiconductor die 12, and the semiconductor die 12 is disposed in the through hole 149. A gap between the semiconductor die 12 and the inner lateral wall 141 may be about 1 mm.

The lower wall 144 of the heat dissipating device 14 is attached or adhered to the first surface 101 of the package substrate 10. The thickness of the heat dissipating device 14 is greater than the thickness of the semiconductor die 12 by about 0.5 mm. Thus, the top surface of the heat dissipating device 14 is higher than the first surface 121 of the semiconductor die 12 by about 0.5 mm. In one embodiment, the inner lateral wall 141, the outer lateral wall 142 and the lower wall 144 may be formed integrally, and then the upper wall 143 covers the inner lateral wall 141 and the outer lateral wall 142.

The vapor chamber 16 is thermally connected to the first surface 121 of the semiconductor die 12. The vapor chamber 16 includes a top wall 161, a bottom wall 162, a top wick structure 163, a bottom wick structure 164, a plurality of wick bars 165 and a first working liquid 166. The material of the top wall 161 and the bottom wall 162 may be copper, copper alloy, aluminum alloy, stainless steel or other suitable metal. The top wall 161 and the bottom wall 162 are sealed together at the periphery rims thereof to define an enclosed chamber for accommodating the first working liquid 166. A material of the first working liquid 166 may be water, ethanol, acetone, isopropanol, chlorofluorocarbon (CFC) or other suitable material. The top wick structure 163 is disposed on an inner surface (e.g., bottom surface) of the top wall 161. The bottom wick structure 164 is disposed on an inner surface (e.g., top surface) of the bottom wall 162. The wick bars 165 are disposed in the enclosed chamber, and two ends of each of the wick bars 165 connect the top wall 161 and the bottom wall 162 respectively.

The bottom wall 162 includes a first portion 1621 and a second portion 1622 surrounding the first portion 1621. The first portion 1621 corresponds to a central portion of the vapor chamber 16, and the second portion 1622 corresponds to a periphery portion of the vapor chamber 16. The first portion 1621 protrudes from the second portion 1622. The thickness of the vapor chamber 16 corresponding to the first portion 1621 (e.g., the central portion) is greater than the thickness of the vapor chamber 16 corresponding to the second portion 1622 (e.g., the periphery portion) by about 0.4 mm. That is, the vapor chamber 16 may not have a consistent thickness, and the wick bars 165 may not have a consistent length. The length of the wick bar 165 corresponding to the first portion 1621 (e.g., the central portion) is greater than the length of the wick bar 165 corresponding to the second portion 1622 (e.g., the periphery portion).

The first portion 1621 is a protrusion portion that is thermally connected and physically connected to the first surface 121 of the semiconductor die 12 through the thermal paste 13. The thermal paste 13 may be a thermal interface material (TIM) with a thermal conductivity of about 30 W/mK to about 40 W/mK. A thickness of the thermal paste 13 may be about 0.1 mm. The thermal paste 13 (e.g., a thermal interface material (TIM)) is used to adhere the first surface 121 of the semiconductor die 12 to the bottom surface of the first portion 1621 of the bottom wall 162 of the vapor chamber 16. As shown in FIG. 3, the first portion 1621 of the bottom wall 162 of the vapor chamber 16 extends into the through hole 149 of the heat dissipating device 14.

In addition, the second portion 1622 of the bottom wall 162 of the vapor chamber 16 is thermally connected and physically connected to the top surface of the heat dissipating device 14 through the thermal adhesive tape 15. A thermal conductivity of the thermal adhesive tape 15 may be about 1 W/mK to about 5 W/mK. The thermal adhesive tape 15 is used to adhere the top surface of the heat dissipating device 14 to the bottom surface of the second portion 1622 of the bottom wall 162 of the vapor chamber 16. The external connecting elements 18 (e.g., solder bumps) are disposed adjacent to the second surface 102 of the package substrate 10. The bottom portions of the external connecting elements 18 (e.g., solder bumps) are disposed in the openings 261 of the first protection layer 26 so that the circuit layer of the package substrate 10 is electrically connected to the circuit layer of the main body 24 of the main substrate 2.

As shown in FIG. 3, during the operation of the semiconductor die 12, the heat generated by the semiconductor die 12 will be absorbed by the first working liquid 166 on the first portion 1621 of the bottom wall 162 of the vapor chamber 16 (e.g., the central portion of the vapor chamber 16) to heat the first working liquid 166 become high-temperature fluid or high-temperature vapor. The heated first working liquid 166 (e.g., high-temperature fluid or high-temperature vapor) will move upwardly to the top wick structure 163, as shown in the first path 31. Then, the heated first working liquid 166 (e.g., high-temperature fluid or high-temperature vapor) will move horizontally along the top wick structure 163 to the periphery portion of the vapor chamber 16, as shown in the second path 32. Thus, the vapor chamber 16 can conduct the heat evenly and quickly so as to obtain an even temperature distribution. Then, the high-temperature fluid or high-temperature vapor in or near the top wick structure 163 will be cooled by the second working liquid 30 of the heat dissipating device 14 to become low-temperature liquid or low-temperature vapor, and then will move downwardly along the wick bars 165, as shown in the third path 33. Then, the low-temperature liquid or low-temperature vapor will move horizontally to the central portion of the vapor chamber 16, as shown in the fourth path 34. Thus, the circulation of the first working liquid 166 and its vapor forms a loop of thermal conduction.

As shown in FIG. 5, meanwhile, the low-temperature second working liquid 30 flows into the enclosed space 140 of the heat dissipating device 14 through the inlet pipe 147 and the inlet 145, as shown in the fifth path 35, and cools the high-temperature fluid or high-temperature vapor in the periphery portion of the vapor chamber 16. Then, the second working liquid 30 becomes a high-temperature liquid and flows out from the enclosed space 140 through the outlet pipe 148 and the outlet 146, as shown in the sixth path 36. Therefore, the heat generated by the semiconductor die 12 is carried out by the first working liquid 166 and the second working liquid 30, thus, the heat dissipation efficiency is relatively high. In addition, the path of the second working liquid 30 in the enclosed space 140 may include a seventh path 37 and an eighth path 38. The seventh path 37 and the eighth path 38 are both sub-paths that from the fifth path 35 to the sixth path 36. In one embodiment, if the semiconductor die 12 has a hot spot 123, the outlet pipe 148 and the outlet 146 may be designed to be disposed near the hot spot 123 so as to avoid the other portion of the semiconductor die 12 from being influenced by high temperature second working liquid 30.

Therefore, the vapor chamber 16 forms or provides a heat transfer path (or heat dissipation path) from the semiconductor die 12 to the heat dissipating device 14. The heat generated by the semiconductor die 12 is transferred or dissipated to the heat dissipating device 14 through the vapor chamber 16. That is, the heat generated by the semiconductor die 12 is absorbed by the first working liquid 166 of the vapor chamber 16 firstly; and then, the heat in the first working liquid 166 of the vapor chamber 16 is absorbed by the second working liquid 30 of the heat dissipating device 14. When the heated second working liquid 30 flows out from the heat dissipating device 14, the heat is taken away from the semiconductor package structure 1.

Figure 6:
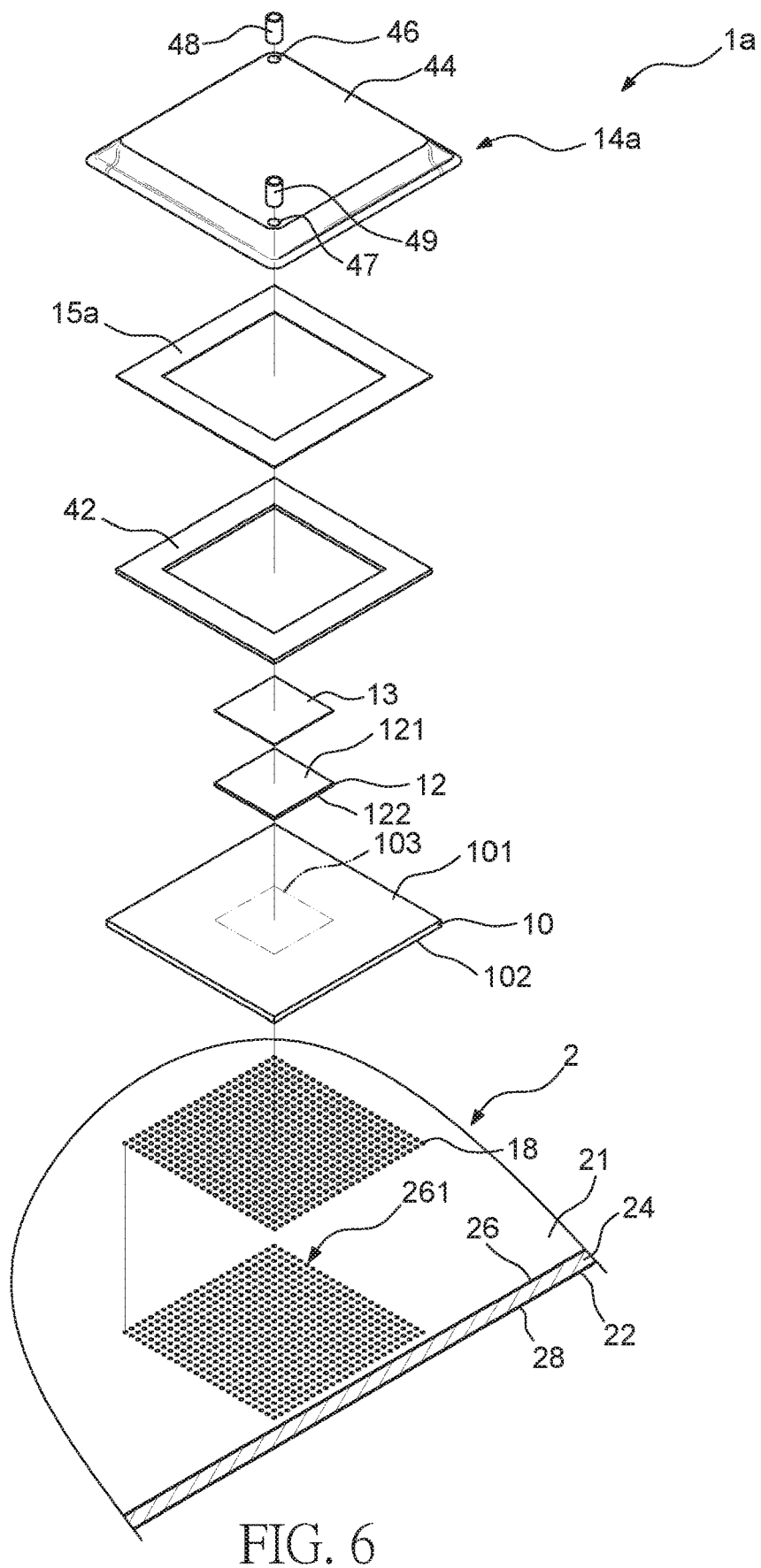
FIG. 6 illustrates an exploded perspective view of a semiconductor package structure and a main substrate according to some embodiments of the present disclosure.
Figure 7:
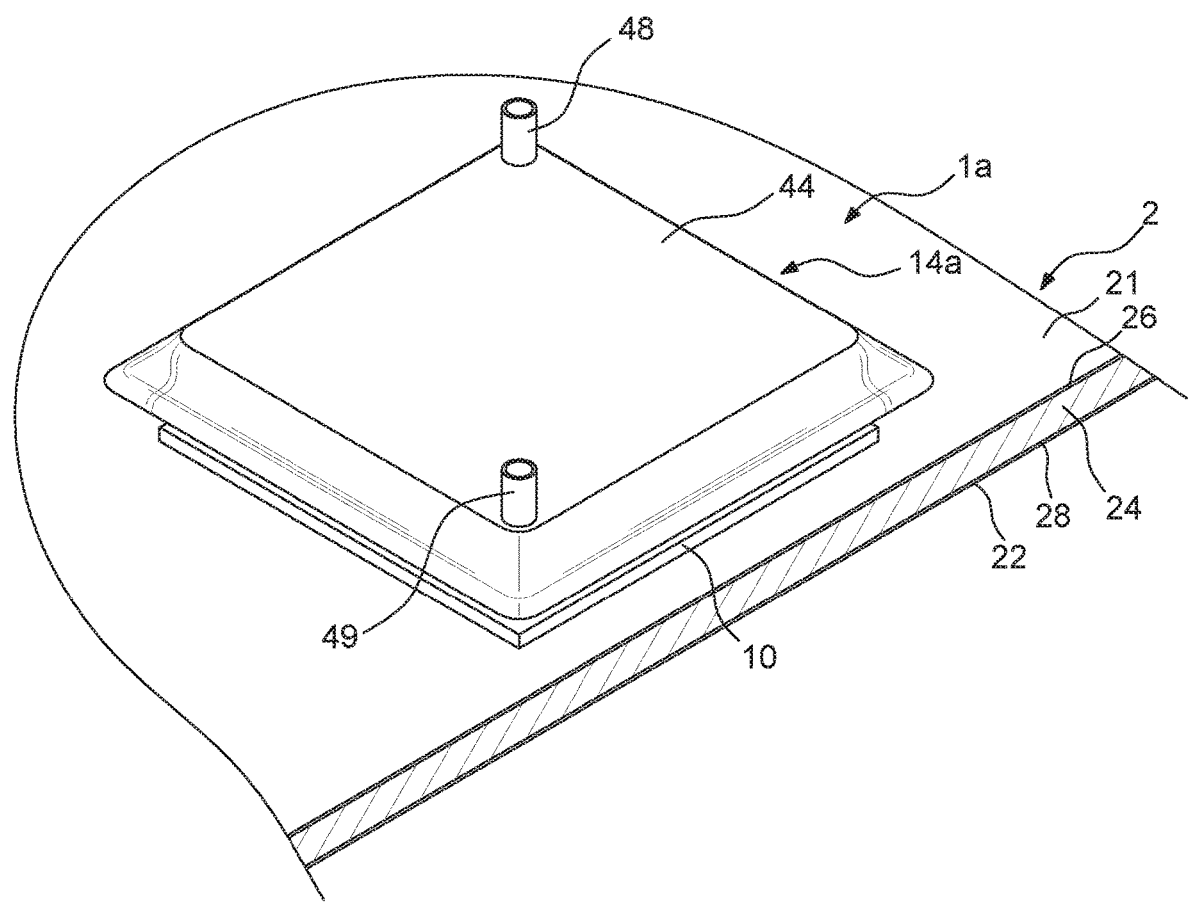
FIG. 7 illustrates an assembled perspective view of the semiconductor package structure and the main substrate of FIG. 6.
Figure 8:
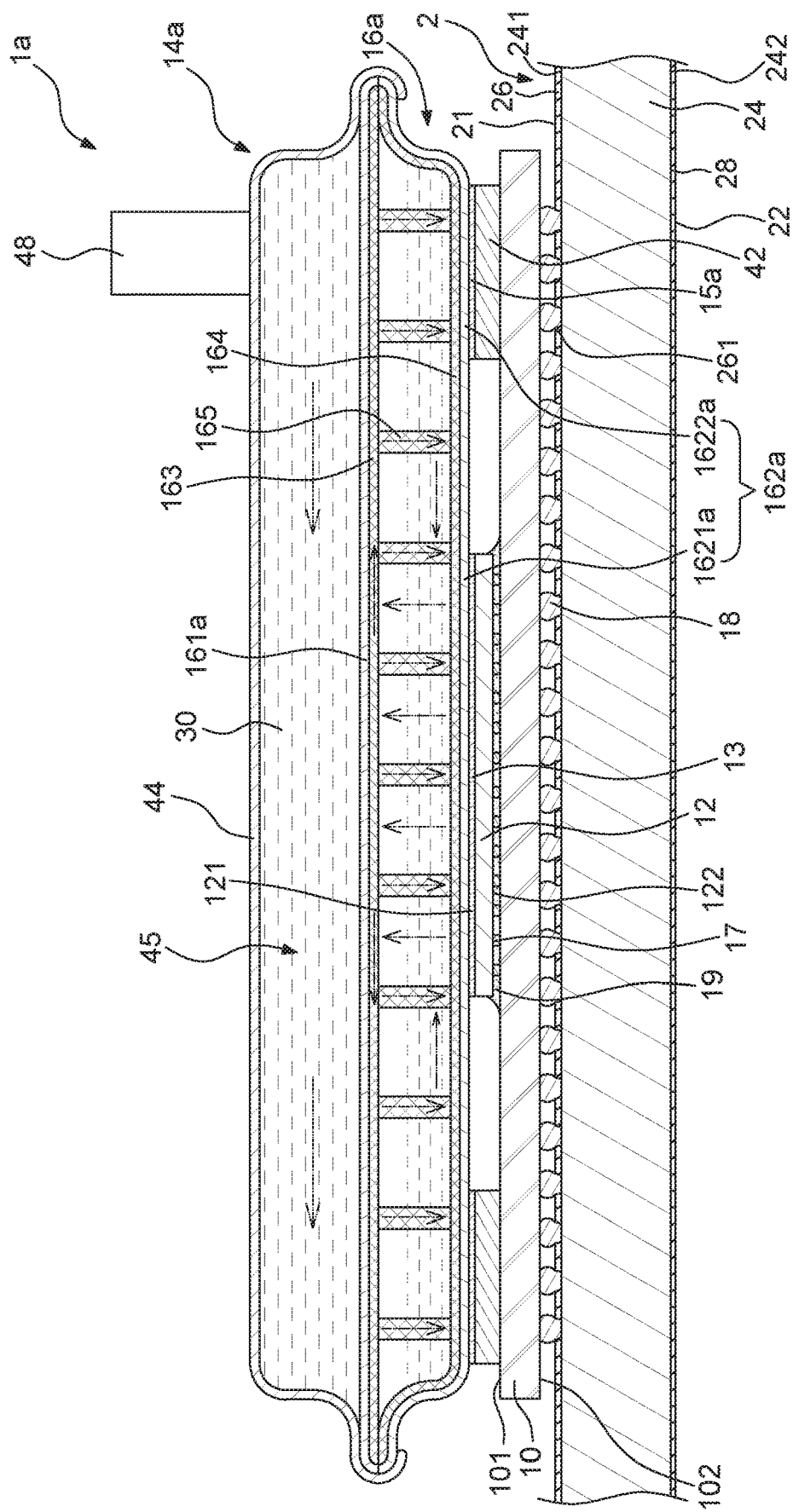
FIG. 8 illustrates a cross-sectional view of the semiconductor package structure and the main substrate of FIG. 7.
Figure 9:
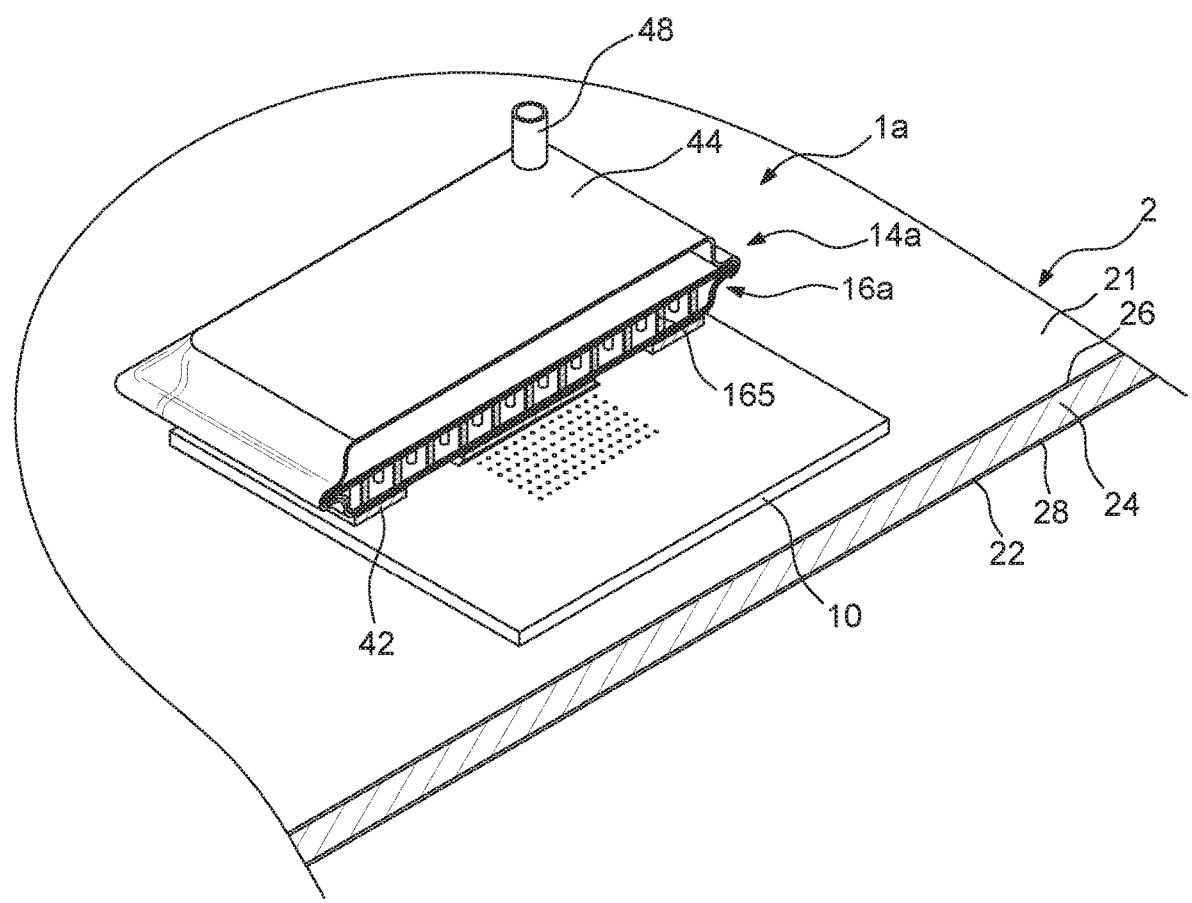
FIG. 9 illustrates a partially cross-sectional view of the semiconductor package structure and the main substrate of FIG. 7.

FIG. 6 illustrates an exploded perspective view of a semiconductor package structure 1a and a main substrate 2 according to some embodiments of the present disclosure. FIG. 7 illustrates an assembled perspective view of the semiconductor package structure 1a and the main substrate 2 of FIG. 6. FIG. 8 illustrates a cross-sectional view of the semiconductor package structure 1a and the main substrate 2 of FIG. 7. FIG. 9 illustrates a partially cross-sectional view of the semiconductor package structure 1a and the main substrate 2 of FIG. 7. The semiconductor package structure 1a of FIG. 6 to FIG. 9 is similar to the semiconductor package structure 1 of FIG. 1 to FIG. 5, and the differences are described as follows.

In the semiconductor package structure 1a, the first portion 1621a and the second portion 1622a of the bottom wall 162a of the vapor chamber 16a are coplanar with each other. In one embodiment, the semiconductor package structure 1a further includes a ring plate 42 disposed between the vapor chamber 16a and the package substrate 10. The ring plate 42 may surround the semiconductor die 12 for supporting the vapor chamber 16a. Further, a top surface of the ring plate 42 may substantially coplanar with the first surface 121 of the semiconductor die 12. As shown in FIG. 8, the first portion 1621a of the bottom wall 162a of the vapor chamber 16a is thermally connected and physically connected to the first surface 121 of the semiconductor die 12 through the thermal paste 13. The second portion 1622a of the bottom wall 162a of the vapor chamber 16a is thermally connected and physically connected to the ring plate 42 through the thermal adhesive tape 15a. In addition, the heat dissipating device 14a is disposed on the vapor chamber 16a. That is, the vapor chamber 16a is disposed between the semiconductor die 12 and the heat dissipating device 14a.

The heat dissipating device 14a includes a covering wall 44. The covering wall 44 and the top wall 161a of the vapor chamber 16a are sealed together at the periphery rims thereof to define a substantially enclosed space 45 for accommodating the second working liquid 30. That is, the enclosed space 45 is defined by the covering wall 44 and the top wall 161a of the vapor chamber 16a. The heat dissipating device 14a and the vapor chamber 16a are integrated as a single device. The material of the covering wall 44 may be copper, copper alloy, aluminum alloy, stainless steel or other suitable metal.

As shown in FIG. 6, the heat dissipating device 14a further includes at least one inlet 46, at least one outlet 47, at least one inlet pipe 48 and at least one outlet pipe 49. The inlet 46 and the outlet 47 are disposed on the covering wall 44. The inlet pipe 48 connects the inlet 46, and the outlet pipe 49 connects the outlet 47. Thus, the inlet pipe 48 and the outlet pipe 49 are in communication with the enclosed space 45. That is, the second working liquid 30 may flow into the enclosed space 45 through the inlet pipe 48 and the inlet 46, and the second working liquid 30 may flow out from the enclosed space 45 through the outlet pipe 49 and the outlet 47 so as to carry out the heat of the top wall 161a of the vapor chamber 16a. The heat dissipating device 14a is a liquid flowing channel. The second working liquid 30 may be water. As shown in FIG. 8, the covering wall 44 of the heat dissipating device 14a is a hat type.

Figure 10:
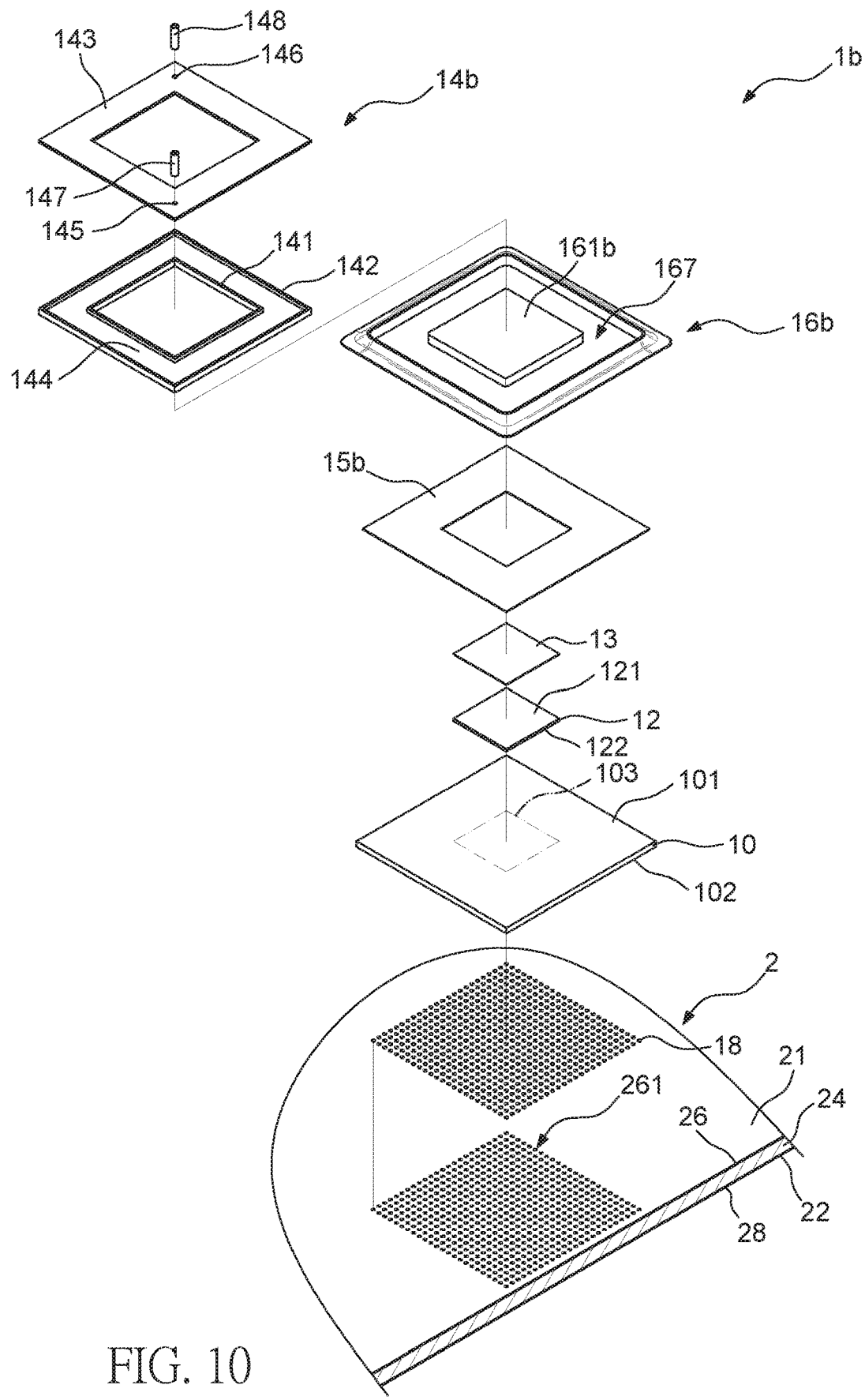
FIG. 10 illustrates an exploded perspective view of a semiconductor package structure and a main substrate according to some embodiments of the present disclosure.
Figure 11:
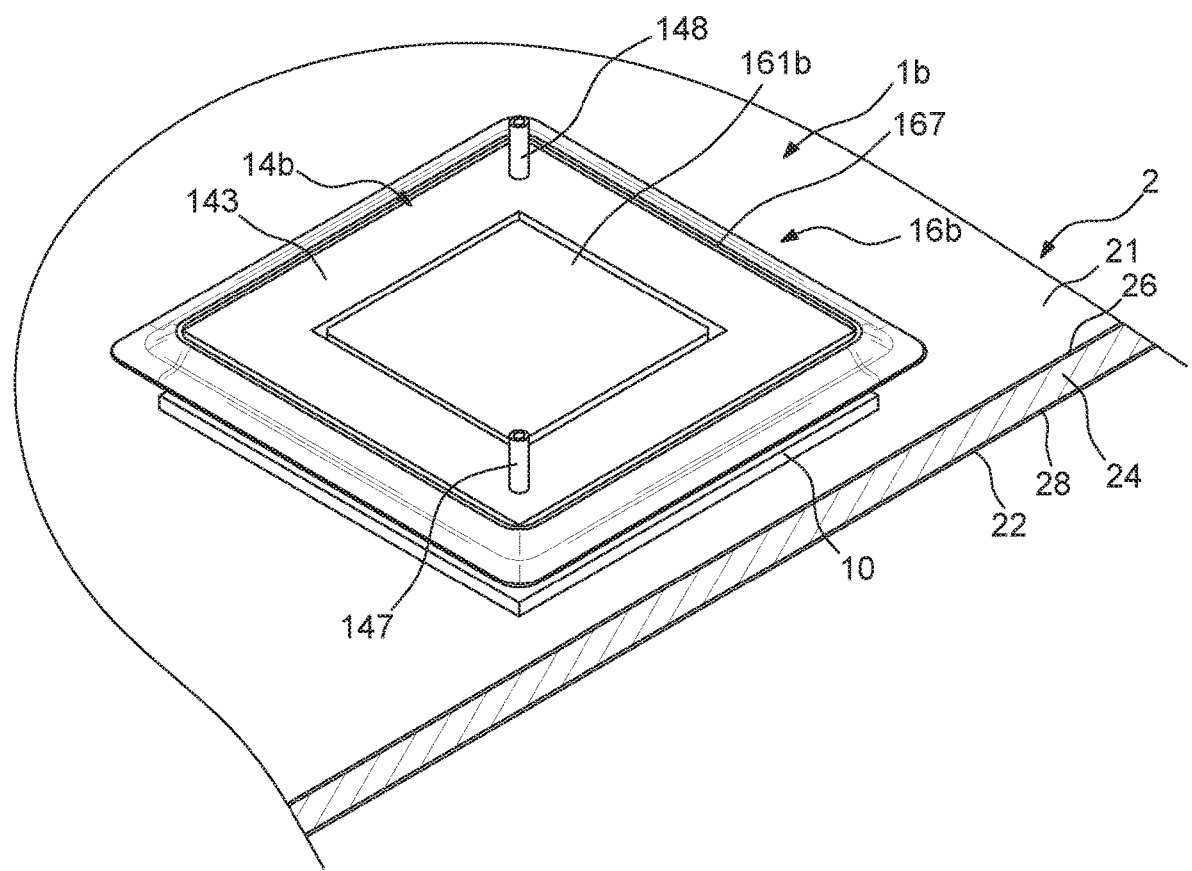
FIG. 11 illustrates an assembled perspective view of the semiconductor package structure and the main substrate of FIG. 10.
Figure 12:
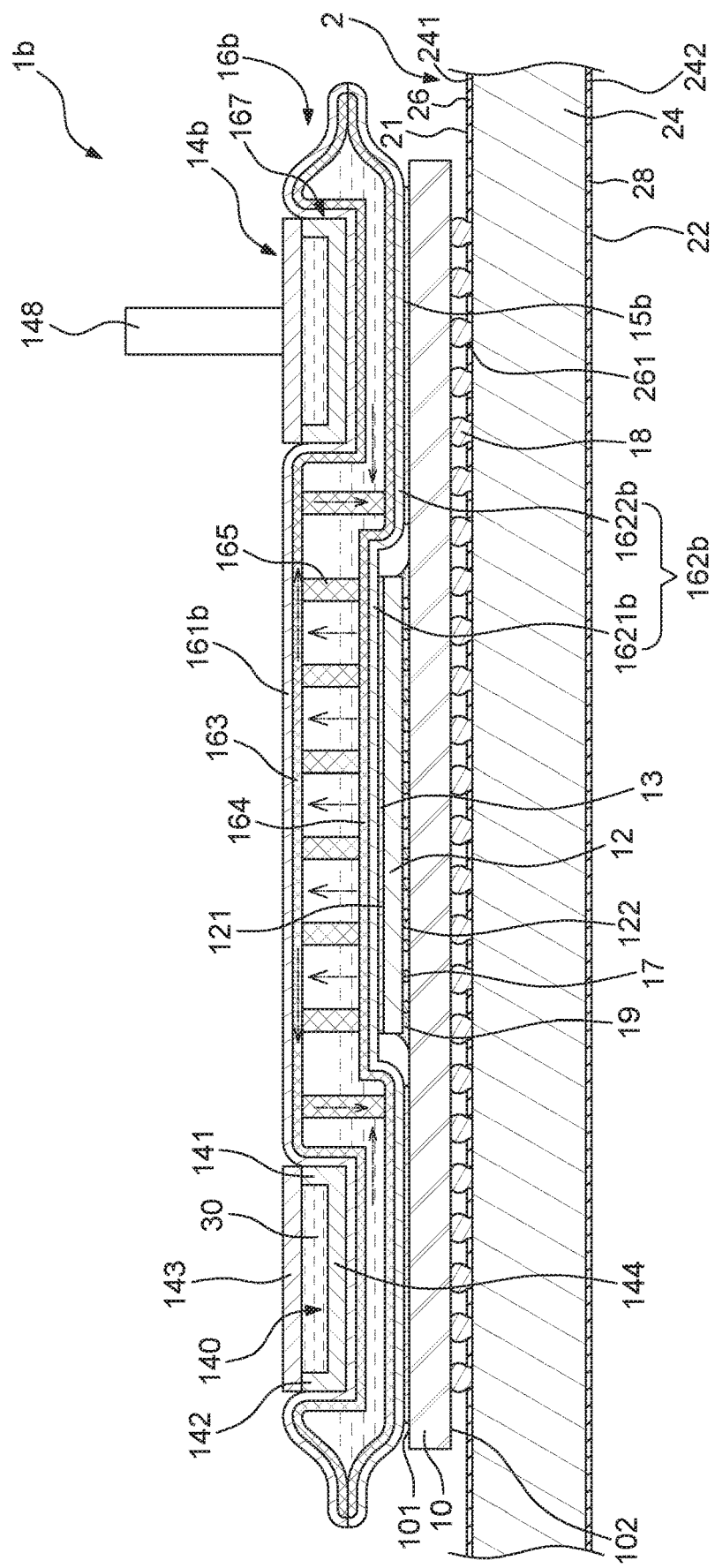
FIG. 12 illustrates a cross-sectional view of the semiconductor package structure and the main substrate of FIG. 11.
Figure 13:
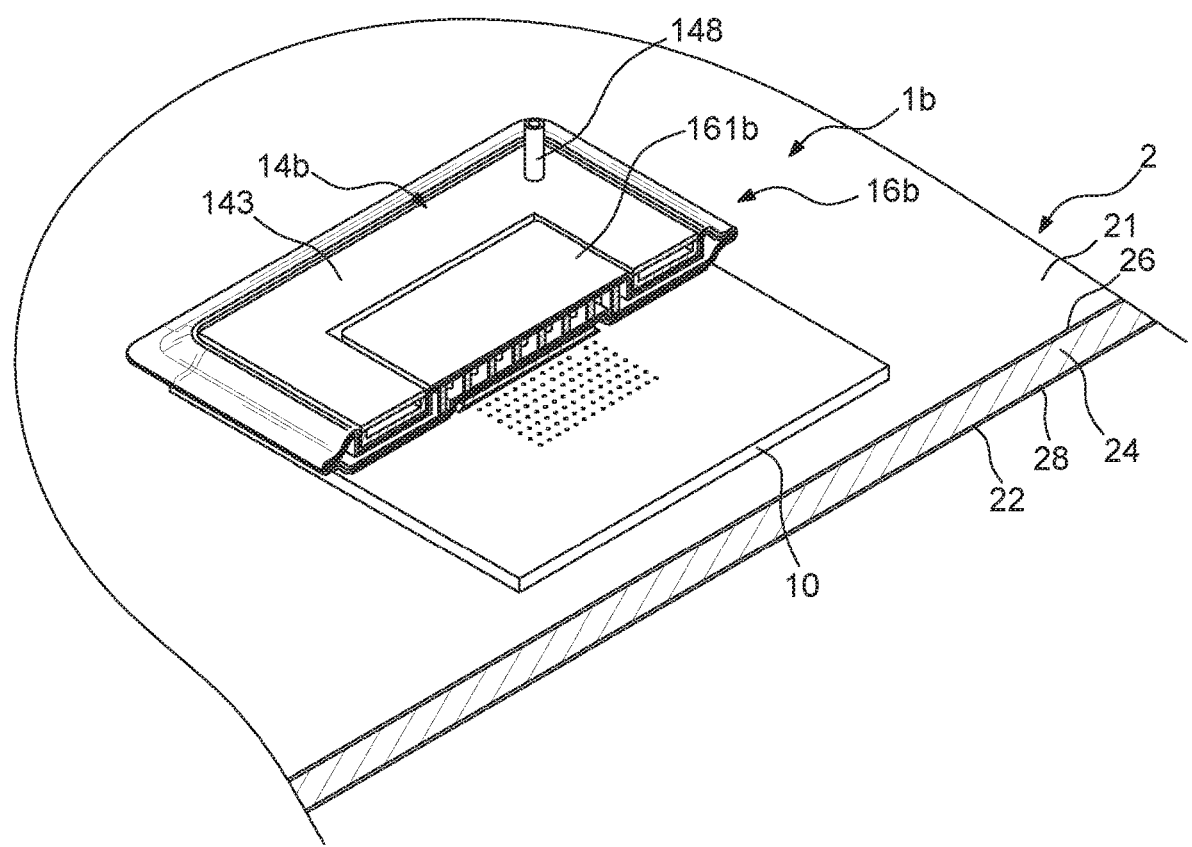
FIG. 13 illustrates a partially cross-sectional view of the semiconductor package structure and the main substrate of FIG. 11.

FIG. 10 illustrates an exploded perspective view of a semiconductor package structure 1b and a main substrate 2 according to some embodiments of the present disclosure. FIG. 11 illustrates an assembled perspective view of the semiconductor package structure 1b and the main substrate 2 of FIG. 10. FIG. 12 illustrates a cross-sectional view of the semiconductor package structure 1b and the main substrate 2 of FIG. 11. FIG. 13 illustrates a partially cross-sectional view of the semiconductor package structure 1b and the main substrate 2 of FIG. 11. The semiconductor package structure 1b of FIG. 10 to FIG. 13 is similar to the semiconductor package structure 1 of FIG. 1 to FIG. 5, and the differences are described as follows.

In the semiconductor package structure 1b, the first portion 1621b of the bottom wall 162b of the vapor chamber 16b is recessed from the second portion 1622b of the bottom wall 162b of the vapor chamber 16b. Thus, the first portion 1621b is a central recessed portion that covers the semiconductor die 12, and the first portion 1621b is thermally connected and physically connected to the first surface 121 of the semiconductor die 12 through the thermal paste 13. Further, the second portion 1622b of the bottom wall 162b of the vapor chamber 16b may be physically connected to the first surface 101 of the package substrate 10 through an adhesive tape 15b. The adhesive tape 15b may be or may not be a thermal adhesive tape. Thus, a portion (e.g., the second portion 1622b of the bottom wall 162b) of the vapor chamber 16b is attached to the package substrate 10 and surrounds the semiconductor die 12.

In addition, the top wall 161b of the vapor chamber 16b further includes a periphery recessed portion 167 that is in a ring shape. The heat dissipating device 14b is disposed in the periphery recessed portion 167 of the vapor chamber 16b. As shown in FIG. 10, the heat dissipating device 14b includes at least one inlet 145, at least one outlet 146, at least one inlet pipe 147 and at least one outlet pipe 148. The inlet 145 and the outlet 146 are disposed on the upper wall 143 of the heat dissipating device 14b. The inlet pipe 147 connects the inlet 145, and the outlet pipe 148 connects the outlet 146. Thus, the inlet pipe 147 and the outlet pipe 148 are in communication with the enclosed space 140. That is, the second working liquid 30 may flow into the enclosed space 140 through the inlet pipe 147 and the inlet 145, and the second working liquid 30 may flow out from the enclosed space 140 through the outlet pipe 148 and the outlet 146 so as to carry out the heat of the top wall 161b in the periphery recessed portion 167 of the vapor chamber 16b.

Figure 14:
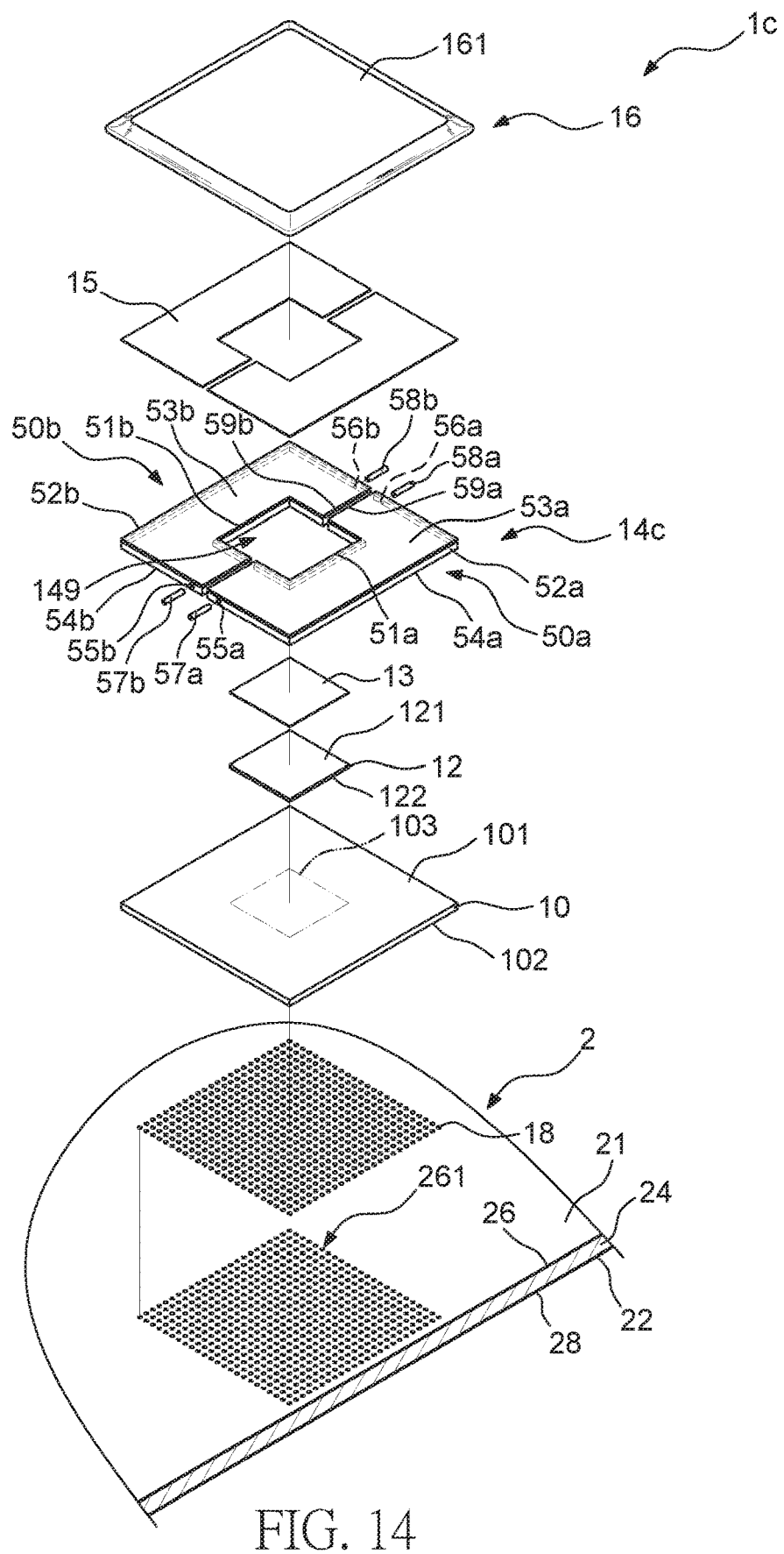
FIG. 14 illustrates an exploded perspective view of a semiconductor package structure and a main substrate according to some embodiments of the present disclosure.
Figure 15:
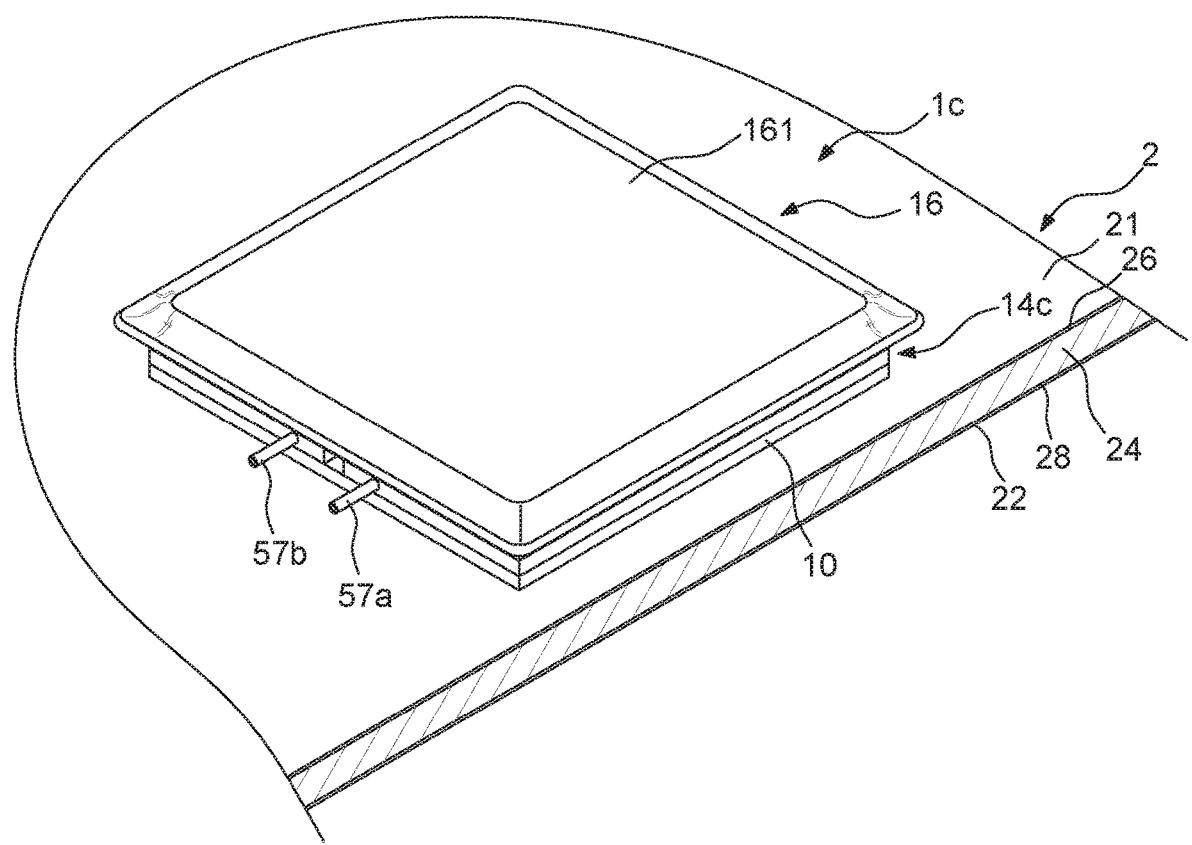
FIG. 15 illustrates an assembled perspective view of the semiconductor package structure and the main substrate of FIG. 14.
Figure 16:
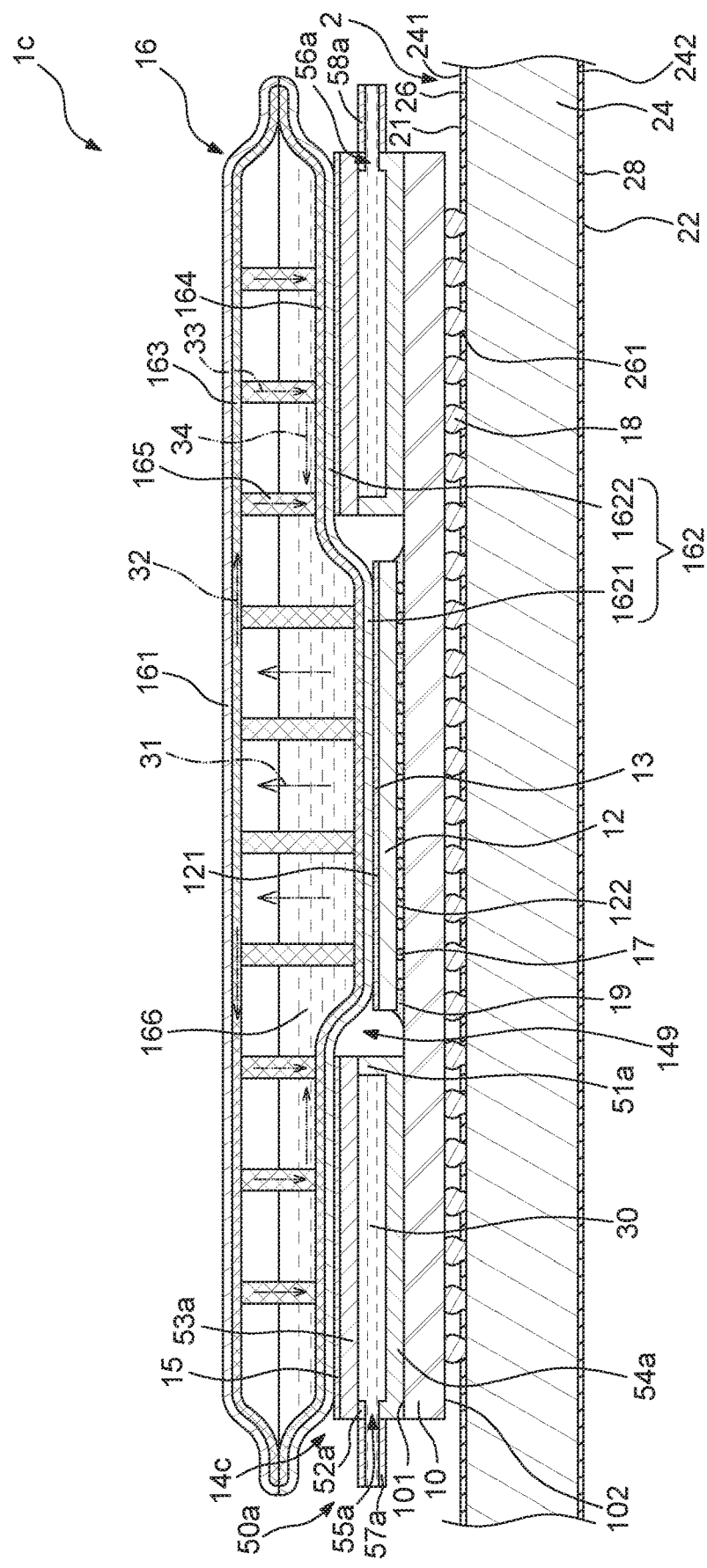
FIG. 16 illustrates a cross-sectional view of the semiconductor package structure and the main substrate of FIG. 15.
Figure 17:
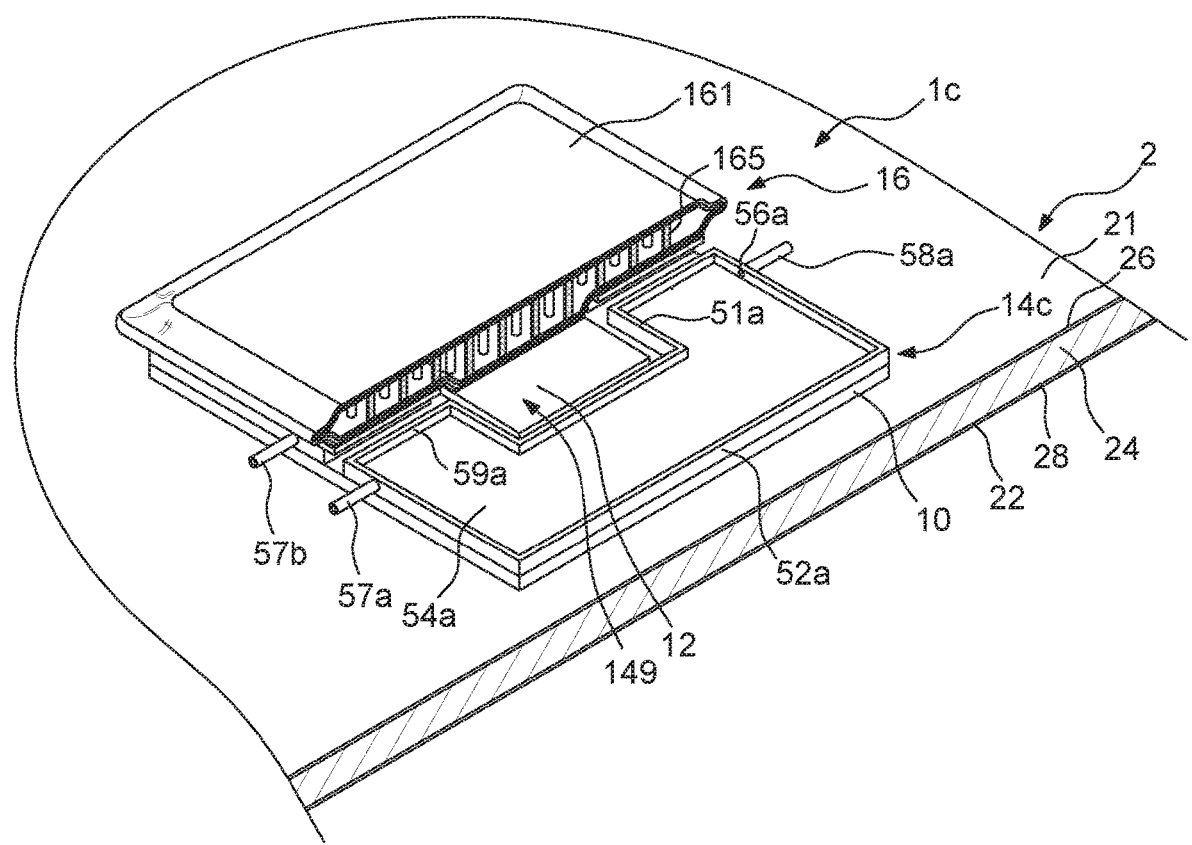
FIG. 17 illustrates a partially cross-sectional view of the semiconductor package structure and the main substrate of FIG. 15.
Figure 18:
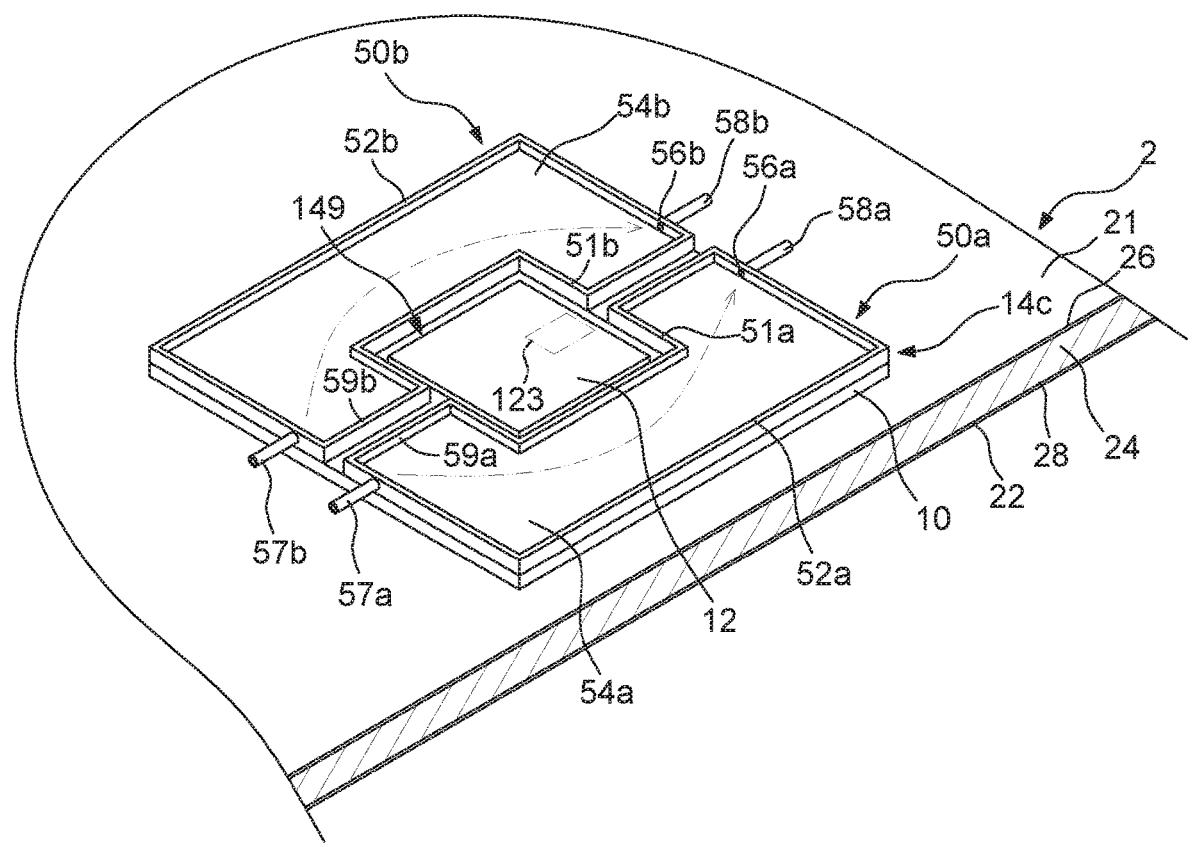
FIG. 18 illustrates an assembled perspective view of the semiconductor package structure and the main substrate of FIG. 14, wherein a vapor chamber and upper walls of a heat dissipating device are omitted for purpose of clarity.

FIG. 14 illustrates an exploded perspective view of a semiconductor package structure 1c and a main substrate 2 according to some embodiments of the present disclosure. FIG. 15 illustrates an assembled perspective view of the semiconductor package structure 1c and the main substrate 2 of FIG. 14. FIG. 16 illustrates a cross-sectional view of the semiconductor package structure 1c and the main substrate 2 of FIG. 15. FIG. 17 illustrates a partially cross-sectional view of the semiconductor package structure 1c and the main substrate 2 of FIG. 15. FIG. 18 illustrates an assembled perspective view of the semiconductor package structure 1c and the main substrate 2 of FIG. 14, wherein the vapor chamber 16 and the upper walls 53a, 53b of the heat dissipating device 14c are omitted for purpose of clarity. The semiconductor package structure 1c of FIG. 14 to FIG. 18 is similar to the semiconductor package structure 1 of FIG. 1 to FIG. 5, and the differences are described as follows. In the semiconductor package structure 1c, the heat dissipating device 14c includes two separate channels, e.g., a first channel 50a and a second channel 50b. The first channel 50a and the second channel 50b are not in communication with each other.

The heat dissipating device 14c surrounds the semiconductor die 12, and is disposed between the vapor chamber 16 and the package substrate 10. The first channel 50a includes a first inner lateral wall 51a, a first outer lateral wall 52a, a first connecting lateral wall 59a, a first upper wall 53a, a first lower wall 54a, at least one first inlet 55a, at least one first outlet 56a, at least one first inlet pipe 57a and at least one first outlet pipe 58a. The first inner lateral wall 51a is in a U shape. The first outer lateral wall 52a surrounds the first inner lateral wall 51a. The first connecting lateral wall 59a connects the first inner lateral wall 51a and the first outer lateral wall 52a. The first upper wall 53a connects a top portion of the first inner lateral wall 51a, a top portion of the first connecting lateral wall 59a and a top portion of the first outer lateral wall 52a. The first lower wall 54a connects a bottom portion of the first inner lateral wall 51a, a bottom portion of the first connecting lateral wall 59a and a bottom portion of the first outer lateral wall 52a. Thus, the first inner lateral wall 51a, the first outer lateral wall 52a, the first connecting lateral wall 59a, the first upper wall 53a and the first lower wall 54a define a substantially first enclosed space for accommodating the second working liquid 30. The first inlet 55a and the first outlet 56a are disposed on the first outer lateral wall 52a. The first inlet pipe 57a connects the first inlet 55a, and the first outlet pipe 58a connects the first outlet 56a. Thus, the first inlet pipe 57a and the first outlet pipe 58a are in communication with the first enclosed space.

The second channel 50b includes a second inner lateral wall 51b, a second outer lateral wall 52b, a second connecting lateral wall 59b, a second upper wall 53b, a second lower wall 54b, at least one second inlet 55b, at least one second outlet 56b, at least one second inlet pipe 57b and at least one second outlet pipe 58b. The second inner lateral wall 51b is in a U shape. The second outer lateral wall 52b surrounds the second inner lateral wall 51b. The second connecting lateral wall 59b connects the second inner lateral wall 51b and the second outer lateral wall 52b. The second upper wall 53b connects a top portion of the second inner lateral wall 51b, a top portion of the second connecting lateral wall 59b and a top portion of the second outer lateral wall 52b. The second lower wall 54b connects a bottom portion of the second inner lateral wall 51b, a bottom portion of the second connecting lateral wall 59b and a bottom portion of the second outer lateral wall 52b. Thus, the second inner lateral wall 51b, the second outer lateral wall 52b, the second connecting lateral wall 59b, the second upper wall 53b and the second lower wall 54b define a substantially second enclosed space for accommodating the second working liquid 30. The second inlet 55b and the second outlet 56b are disposed on the second outer lateral wall 52b. The second inlet pipe 57b connects the second inlet 55b, and the second outlet pipe 58b connects the second outlet 56b. Thus, the second inlet pipe 57b and the second outlet pipe 58b are in communication with the second enclosed space.

As shown in FIG. 18, if the semiconductor die 12 has a hot spot 123, the first outlet pipe 58a, the first outlet 56a, the second outlet pipe 58b and the second outlet 56b may be designed to be disposed near the hot spot 123 so as to avoid the other portion of the semiconductor die 12 from being influenced by high temperature second working liquid 30.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±10, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a package substrate having a first surface and a second surface opposite to the first surface;
   a semiconductor die electrically connected to the first surface of the package substrate;
   a vapor chamber thermally connected to a first surface of the semiconductor die, wherein the vapor chamber defines an enclosed chamber for accommodating a first working liquid; and
   a heat dissipating device thermally connected to the vapor chamber, wherein the heat dissipating device defines a substantially enclosed space for accommodating a second working liquid.

2. The semiconductor package structure of claim 1, wherein the semiconductor die is electrically connected to the first surface of the package substrate through a flip-chip bonding.

3. The semiconductor package structure of claim 1, wherein the vapor chamber is physically connected to the first surface of the semiconductor die.

4. The semiconductor package structure of claim 1, wherein the vapor chamber includes a top wall, a bottom wall, a top wick structure, a bottom wick structure, a plurality of wick bars and the first working liquid, the top wall and the bottom wall are sealed together at the periphery rims thereof to define the enclosed chamber, the top wick structure is disposed on an inner surface of the top wall, the bottom wick structure is disposed on an inner surface of the bottom wall, two ends of each of the wick bars connect the top wall and the bottom wall respectively.

5. The semiconductor package structure of claim 1, wherein the vapor chamber includes a protrusion portion that is physically connected to the first surface of the semiconductor die.

6. The semiconductor package structure of claim 1, wherein the heat dissipating device surrounds the semiconductor die, and is disposed between the vapor chamber and the package substrate.

7. The semiconductor package structure of claim 1, further comprising a ring plate disposed between the vapor chamber and the package substrate, wherein the heat dissipating device is disposed on the vapor chamber.

8. The semiconductor package structure of claim 1, wherein the vapor chamber includes a central recessed portion that covers the semiconductor die.

9. The semiconductor package structure of claim 8, wherein the vapor chamber further includes a periphery recessed portion, and the heat dissipating device is disposed in the periphery recessed portion of the vapor chamber.

10. The semiconductor package structure of claim 1, wherein the heat dissipating device includes two separate channels.

11. The semiconductor package structure of claim 1, wherein the heat dissipating device is a ring type.

12. The semiconductor package structure of claim 1, wherein the heat dissipating device includes at least one inlet and at least one outlet.

13. The semiconductor package structure of claim 1, wherein the heat dissipating device includes an inner lateral wall, an outer lateral wall, an upper wall and a lower wall, the inner lateral wall is a ring shape and defines a through hole, the outer lateral wall surrounds the inner lateral wall, the upper wall connects a top portion of the inner lateral wall and a top portion of the outer lateral wall, the lower wall connects a bottom portion of the inner lateral wall and a bottom portion of the outer lateral wall, and the inner lateral wall, the outer lateral wall, the upper wall and the lower wall define the substantially enclosed space.

14. The semiconductor package structure of claim 1, wherein the heat dissipating device includes a covering wall, the covering wall and a top wall of the vapor chamber are sealed together at the periphery rims thereof to define the substantially enclosed space.

15. A semiconductor package structure, comprising:
    a package substrate;
    a semiconductor die electrically connected to the package substrate;
    a vapor chamber thermally connected to the semiconductor die; and
    a heat dissipating device thermally connected to the vapor chamber, wherein the vapor chamber forms a heat transfer path from the semiconductor die to the heat dissipating device.

16. The semiconductor package structure of claim 15, wherein the vapor chamber is disposed between the semiconductor die and the heat dissipating device.

17. The semiconductor package structure of claim 15, wherein the semiconductor die and the heat dissipating device are disposed between the vapor chamber and the package substrate.

18. The semiconductor package structure of claim 17, wherein the heat dissipating device surrounds the semiconductor die.

19. The semiconductor package structure of claim 15, wherein the heat dissipating device is attached to the package substrate.

20. The semiconductor package structure of claim 15, wherein a portion of the vapor chamber is attached to the package substrate.

\* \* \* \* \*